(12) United States Patent
Trovarelli et al.

(10) Patent No.: US 7,906,421 B2
(45) Date of Patent: Mar. 15, 2011

(54) METHOD FOR APPLYING SOLDER TO REDISTRIBUTION LINES

(75) Inventors: Octavio Trovarelli, Dresden (DE); Martin Reiss, Dresden (DE); Bernd Zimmermann, Dresden (DE)

(73) Assignee: Qimonda AG, München (DE)

( * ) Notice: Subject to any disclaimer, the term of this patent is extended or adjusted under 35 U.S.C. 154(b) by 923 days.

(21) Appl. No.: 11/766,326

(22) Filed: Jun. 21, 2007

(65) Prior Publication Data

US 2007/0298602 A1 Dec. 27, 2007

(30) Foreign Application Priority Data

Jun. 21, 2006 (DE) .................. 10 2006 028 811

(51) Int. Cl.
*H01L 21/00* (2006.01)
*H01L 21/44* (2006.01)
*H01L 21/4763* (2006.01)
(52) U.S. Cl. ......... 438/612; 438/598; 438/613; 438/622
(58) Field of Classification Search .................. 438/598, 438/612, 613, 622
See application file for complete search history.

(56) References Cited

U.S. PATENT DOCUMENTS

| | | | | |
|---|---|---|---|---|
| 6,114,187 | A * | 9/2000 | Hayes | 438/106 |
| 6,200,888 | B1 * | 3/2001 | Ito et al. | 438/597 |
| 7,045,908 | B2 * | 5/2006 | Ohsumi | 257/797 |
| 2002/0173073 | A1 | 11/2002 | Liang et al. | |
| 2002/0185721 | A1 | 12/2002 | Hwang et al. | |
| 2004/0121606 | A1 | 6/2004 | Raskin et al. | |
| 2005/0026413 | A1 * | 2/2005 | Lee et al. | 438/612 |
| 2005/0230835 | A1 * | 10/2005 | Sunohara et al. | 257/758 |
| 2005/0253264 | A1 * | 11/2005 | Aiba et al. | 257/738 |

FOREIGN PATENT DOCUMENTS

DE   197 12 219 A1   10/1998
DE   102 58 081 A1   7/2004

* cited by examiner

*Primary Examiner* — Matthew C Landau
*Assistant Examiner* — James M Mitchell
(74) *Attorney, Agent, or Firm* — Cohen Pontani Lieberman & Pavane LLP

(57) ABSTRACT

In a method of making an electronic component, an electrically conductive redistribution line is formed on a surface of a semiconductor chip. The redistribution line includes a solder pad. A covering material is formed over the solder pad and an uncovered portion of the redistribution line is passivated. The covering material prevents passivation of the solder pad. Solder is then formed over the solder pad such that the uncovered portion of the redistribution line has solder resist properties due to the passivating.

28 Claims, 3 Drawing Sheets

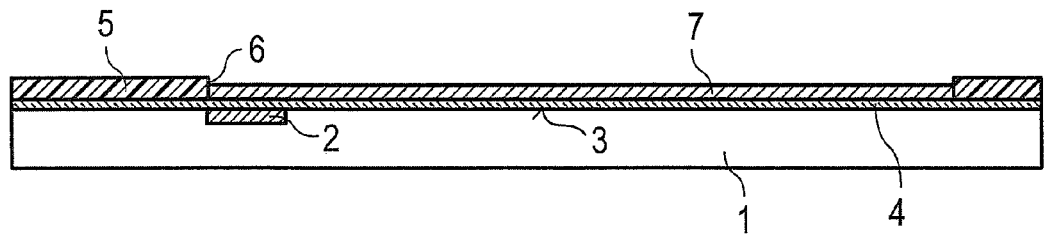
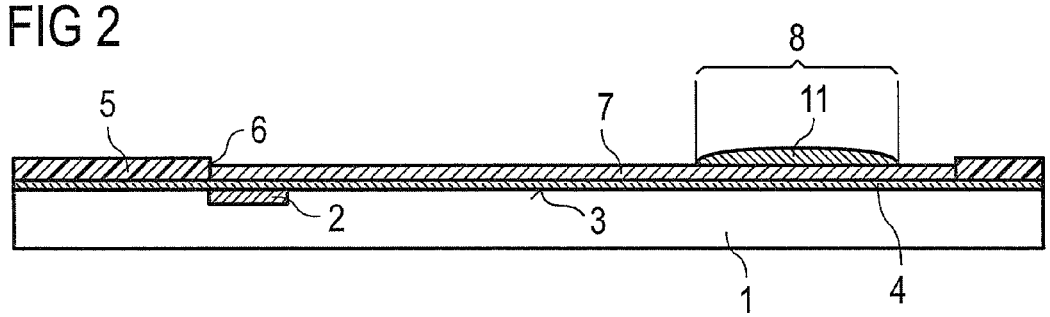
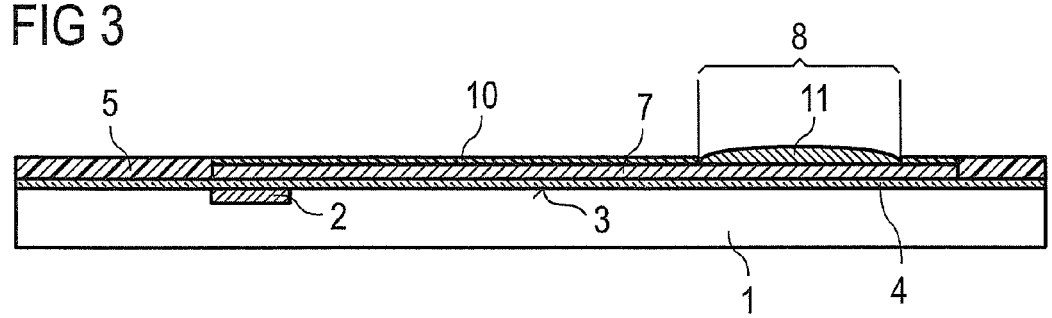
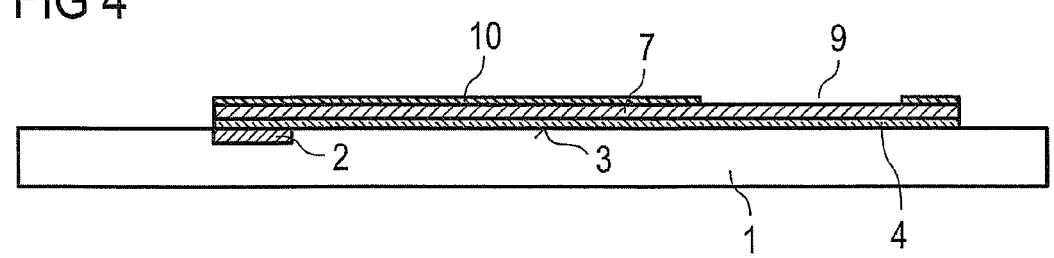

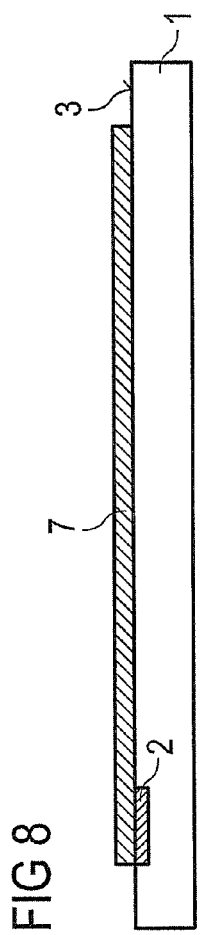
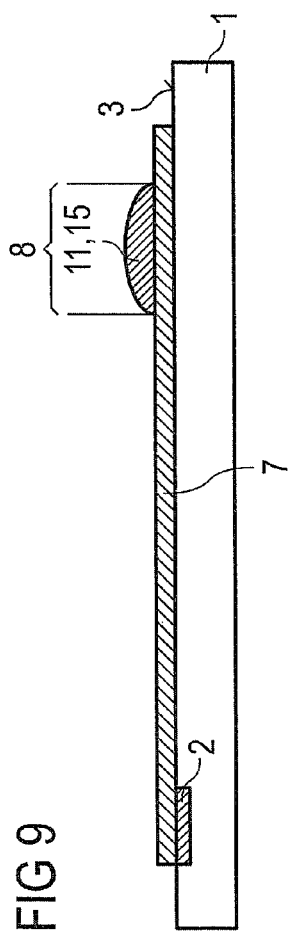
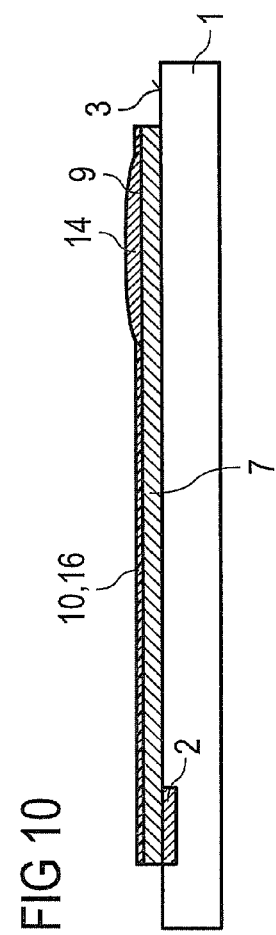
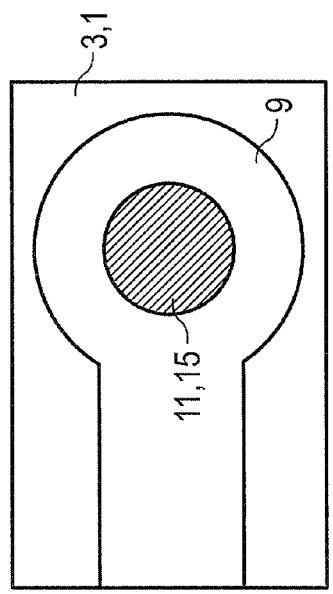
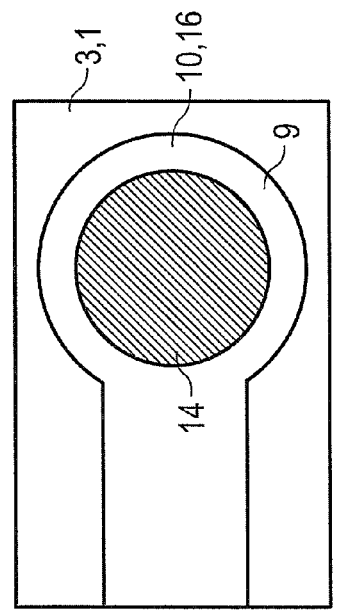
FIG 8
FIG 9
FIG 10

METHOD FOR APPLYING SOLDER TO REDISTRIBUTION LINES

This application claims priority to German Patent Application 10 2006 028 811.4, which was filed Jun. 21, 2006 and is incorporated herein by reference.

TECHNICAL FIELD

An embodiment of the invention relates to a method for applying solder to redistribution lines.

BACKGROUND

In the mounting of semiconductor chips, it is known to provide the surface of the semiconductor chips with solder, in order to mount the semiconductor chips on a substrate and connect them in an electrically conducting manner by means of this solder.

An electrically conducting connection is produced between a contact point on the surface of the semiconductor chip and a corresponding contact point on the substrate. Since the contact points on the substrate are generally located at a different position than the contact points on the surface of the semiconductor chip, redistribution lines are provided between the contact points on the surface of the semiconductor chip and contact points on the semiconductor chip that correspond to the contact points on the substrate.

As described for example in German Patent Application DE 102 58 081 A1, the redistribution lines are produced from an electrically conductive layer, known as a redistribution layer. In this case, a sacrificial layer, known as a seed layer, is first applied to the entire semiconductor surface. Then a mask, which has mask openings at the points that are intended later to receive the redistribution lines, is applied to the seed layer. By means of an electrolytic process, the metal of the redistribution lines is then deposited in the mask openings. In particular electrostatic potential is applied to the seed layer. In this process, a copper layer is first deposited. The surface of this copper layer is passivated by a nickel layer. Since this nickel layer represents a poor adhesive base for the solder, the surface of the nickel layer is subsequently provided with a gold layer.

The gold layer on the redistribution layer is then possibly partially removed again in a further photolithographic process at the points at which the redistribution layer is not wetted with solder.

In order to prevent uncontrolled flowing away of solder in further process steps, a layer of a solder resist is subsequently deposited over the entire surface. At the points at which the solder is then to be applied, the layer of solder resist is then opened by means of a photolithographic process. In these openings, a flux is then deposited and solder balls are applied. The solder balls are then melted on the redistribution layer by means of a melting process.

A disadvantage of this method is that additional laborious process steps, such as coating, exposing, developing and curing, are required for the creation of the solder resist mask, with the effect of increasing production expenditure.

SUMMARY OF THE INVENTION

As one advantageous feature, embodiments of the invention minimize the expenditure for producing a solder resist mask.

For example, a covering can be applied to prevent passivation of the redistribution line to the solder pad on the metallic surface of the redistribution line. Subsequently a passivation of the surface of the redistribution line can be carried out, thereby forming solder resist properties on this surface.

In a first embodiment of the method, a metallically conductive sacrificial layer is applied to the surface of a semiconductor chip. The surface of the sacrificial layer is provided with a mask, which has a mask opening for the redistribution line that is to be produced. In this mask opening, the redistribution line is applied layer by layer, with a copper layer and a passivation layer, and the solder is melted onto the solder pad on the surface of the redistribution line, restricted by the solder resist layer. According to an embodiment of the invention, after applying the copper layer, a covering material is applied to the solder pad on the surface of the copper layer. This covering material thereby covers an area which corresponds to an opening to be produced in the passivation layer on the solder pad. The covering material comprises a material preventing subsequent deposition of the passivation layer. Subsequently, the deposition of the passivation layer acting at the same time as a solder resist layer is performed. After that, the mask and the covering material are removed and the solder is introduced in the form of a solder ball into the opening that remains in the solder resist layer, onto the solder pad.

Arranging the covering material on the copper layer has the effect of preventing the passivation layer from being deposited in the region of this covering material. If the covering material is then removed, the opening in the passivation layer remains at this point. Since the passivation layer at the same time has solder resist properties, the solder ball can be positioned and melted in this opening without any flowing away of the solder occurring. It is consequently evident that it is possible to dispense with the laborious lithographic process for producing a solder resist layer such as that which is required in the prior art.

An expedient refinement of this first embodiment of the invention is that the covering material is removed at the same time as the mask. An additional process step for removing the covering material can consequently be avoided.

In a second embodiment of the method, a metallically conductive sacrificial layer is once again applied to the surface of a semiconductor chip. The surface of the sacrificial layer is provided with a mask, which has a mask opening for the redistribution line that is to be produced. In this mask opening, the redistribution line is applied layer by layer, with a copper layer and a passivation layer, and the solder is melted onto the solder pad on the surface of the redistribution line, restricted by the solder resist layer. After applying the copper layer, a covering material having properties of a flux and preventing subsequent deposition of the passivation layer is applied to the solder pad on the surface of the copper layer. Subsequently, the deposition of the passivation layer acting at the same time as a solder resist layer is performed. After that, the mask is removed and the solder is introduced in the form of a solder ball into an opening in the solder resist layer that remains on the solder pad, onto the covering material acting as a flux. Consequently, the difference between this second embodiment and the first embodiment described above is substantially that the covering material remains on the copper layer after depositing of the passivation layer and this covering material serves at the same time as a flux, so that it is possible to dispense with the additional application of a flux.

The method according to an embodiment of the invention can be expediently refined in both embodiments in the way described below.

In a preferred variant of the method, it is provided that the passivation layer, which at the same time assumes the function of the solder resist layer, is itself applied from a material with solder resist properties.

In the simplest way, this passivation and solder resist layer may be applied as a nickel layer. This allows conventional galvanic processes to be used.

In another embodiment, it is provided in this respect that the passivation and solder resist layer is applied as a polymer layer. The polymer layer used on the one hand assumes the solder resist function and on the other hand serves for covering the copper layer, and consequently for preventing environmental influences. To apply a polymer layer, it is not absolutely necessary to use a galvanic process. Rather, coating, spraying or the application of a screen printing method is also possible here.

In another variant of the method according to an embodiment of the invention, it is provided that the solder resist properties of the passivation layer are produced by an oxidation of the surface of the passivation layer. Here, the material of the passivation layer in itself does not exhibit any solder resist properties, or exhibits minor solder resist properties. Such an oxidation step allows the variety of materials that are available for the passivation layer to be increased.

However, it is also possible that the passivation layer is produced as an oxidation layer from the copper layer.

In another embodiment of the method according to the invention, the covering material is applied in the form of a solder paste. The solder is subsequently melted from the solder paste and then the redistribution line is passivated.

In this respect, it is expedient that the redistribution line is passivated by oxidation.

In an expedient way, it is provided in the case of all three embodiments that the covering material is applied by the screen printing method. With the screen printing method, relatively small structures can be produced, so that the production of an opening in the passivation layer of the order of magnitude of 100 to several 100 µm does not present any problem.

BRIEF DESCRIPTION OF THE DRAWINGS

The invention is now to be explained in more detail on the basis of an exemplary embodiment. In the associated drawings:

FIG. 1 shows the process step of applying a copper layer to a semiconductor chip;

FIG. 2 shows the process step of applying a covering layer;

FIG. 3 shows the process step of applying a passivation layer to the semiconductor chip;

FIG. 4 shows the process step of removing the mask and the covering layer;

FIG. 8 shows a cross section through a detail of a chip with an applied redistribution line according to a further exemplary embodiment;

FIG. 9 shows the cross section that is shown in FIG. 8, with solder paste on the solder pad, and a plan view of the solder pad; and FIG. 10 shows a cross section through the detail of the chip, with a passivated redistribution line and melted solder, and a plan view of the solder pad.

DETAILED DESCRIPTION OF ILLUSTRATIVE EMBODIMENTS

Figure 5:
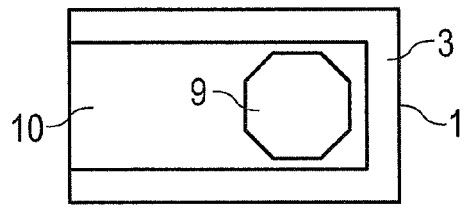
FIG. 5 shows a plan view of the structure according to FIG. 4.

As represented in FIG. 1, contact points 2 are arranged on the semiconductor chip 1. The contact points 2 are connected in an electrically conducting manner to a circuit structure (not represented any more specifically) in the semiconductor chip 1. In order to connect these contact points 2 to corresponding contact points on a substrate that is not represented any more specifically, it is necessary to perform a redistribution. For this purpose, a seed layer 4 is deposited onto the surface 3 of the semiconductor chip 1. The seed layer 4 serves for the contacting of the entire surface 3 with respect to an electrical potential for the later electrolytic deposition of layers.

The upper side of the seed layer 4 is provided with a mask 5. The mask 5 is provided with mask openings 6. As represented in FIG. 1, a copper layer is deposited in the region of the mask opening 6 and forms a redistribution line 7 as a consequence of the structuring by way of the mask opening.

A first exemplary embodiment method is described now.

As represented in FIG. 2, a covering material 11, which comprises an organic material, is applied by means of a screen printing method in the region 8, which will later form the solder pad 9 represented in FIG. 4. At this point, the region 8 takes the form of an opening in a passivation layer 10.

As represented in FIG. 3, the passivation layer 10 is subsequently deposited on the upper side of the copper layer of the redistribution line 7. The passivation layer 10 comprises a nickel layer.

The material of the covering material 11 has been chosen such that it prevents deposition of the passivation layer 10 on the covering material 11. After removal of the covering material 11 from the upper side of the redistribution line 7, a solder pad 9 is produced in the form of an opening in the passivation layer 10. The redistribution line 7 is consequently provided on its front side with the solder pad 9, which serves for the later production of an electrically conducting connection to the outside. For the sake of simplicity, this connection is not represented any more specifically. By means of the redistribution line 7, the solder pad 9 is connected in an electrically conducting manner to the contact points 2.

As represented in FIG. 5, the solder pad 9 is restricted in its overall extent by the passivation layer 10. Since the passivation layer 10 also acts as a solder resist layer, flowing away of a solder is thereby avoided. As also shown in FIG. 4, portions of the seed layer 4 and mask 5 outside the redistribution line 7 have been removed.

Figure 6:
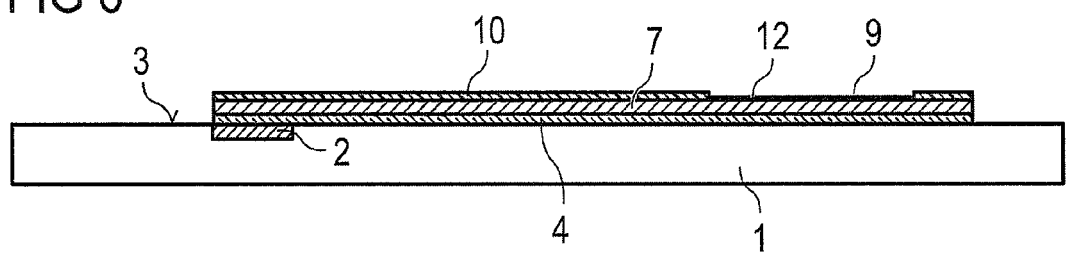
FIG. 6 shows the process step of introducing soldering flux.
Figure 7:
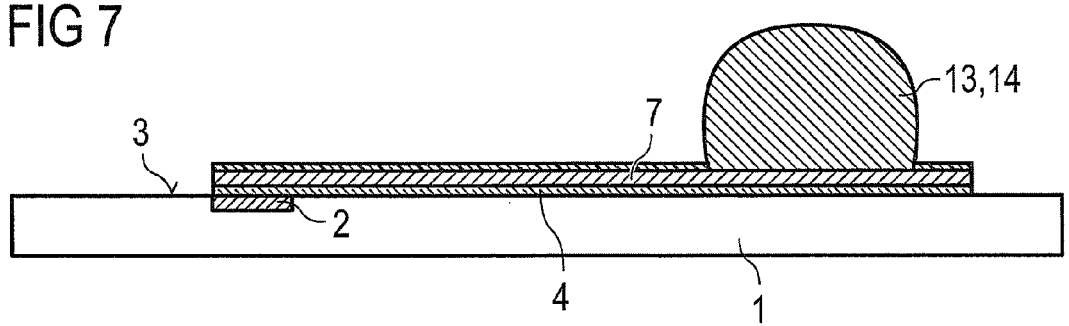
FIG. 7 shows the process step of melting a solder ball.

Then, in a way corresponding to FIG. 6, a flux 12 is introduced onto the solder pad 9, i.e., into the opening in the passivation layer 10. Subsequently, as represented in FIG. 7, the solder 13 is applied to the solder pad 9, in that a solder ball 14 is placed in and a melting process is initiated, so that, with the aid of the flux 12, the solder ball 14 becomes bonded with the copper layer of the redistribution line 7. The semiconductor chip 1 is then available for mounting on a substrate.

A second exemplary embodiment, is described below. Here, the covering material 11 already comprises a flux. In the example above, flux 12 was applied during the process steps shown in FIG. 6.

As represented in FIG. 3, the passivation layer 10 is subsequently deposited onto the upper side of the copper layer of the redistribution line 7 on the basis of process steps already described above in relation to FIG. 1 and FIG. 2. In one embodiment, the passivation layer 10 comprises a nickel layer.

Since the covering material 11 comprises flux, which likewise prevents deposition of the passivation layer 10, the solder pad 9 is produced on the upper side of the redistribution line 7 in the form of an opening in the passivation layer 10. Consequently, the redistribution line 7 is provided on its front side with a solder pad 9, which serves for the later production of an electrically conducting connection to the outside that is not represented any more specifically. By means of the redistribution line 7, the solder pad 9 is then connected in an electrically conducting manner to the contact points 2. In the case of this second embodiment, it is possible to dispense with removal of the covering material 11, as represented in FIG. 4, and application of flux 12, as represented in FIG. 6.

It is also the case in this embodiment of the method, as represented in FIG. 5, that the solder pad 9 is restricted in its overall extent by the passivation layer 10. Since the passivation layer 10 also acts as a solder resist layer, flowing away of a solder is thereby avoided.

As represented in FIG. 7, the solder ball 14 is then placed onto the solder pad 9 and a melting process initiated, so that, with the aid of the flux 12, the solder ball 14 becomes bonded with the copper layer of the redistribution line 7. The semiconductor chip 1 is then available for mounting on a substrate.

A third exemplary embodiment, is described below.

As represented in FIG. 8, here too it is assumed that a redistribution line 7 is provided for connecting a contact point 2 to an external contact point that is not represented any more specifically. In this case too, the redistribution line 7 also includes a solderable metal and is produced, for example, from a copper layer.

As represented in FIG. 9, a solder paste 15 is then applied directly to the solder pad 9 on the redistribution line 7 by a screen printing process. The solder paste 15 itself is a pasty material, which includes small particles of a solder that are bound in a flux.

As represented in FIG. 10, the redistribution line 7 is subsequently subjected to an oxidation process, so that the redistribution line 7 is provided on its upper side with an oxide layer 16, which serves as a passivation layer 10.

Since the solder paste 15 at the same time assumes the function of a covering material 11, such as that described in the previous two exemplary embodiments, no oxidation of the redistribution line 7 takes place under the solder paste 15. On the other hand, the oxidation layer 16 represents a solder resist layer. If the redistribution line 7 is then subsequently subjected to a melting temperature for the solder paste 15, the solder particles in the solder paste 15 melt and the solder 13 becomes bonded with the solder pad 9. The function of the oxide layer 16 as a solder resist layer thereby has the effect of preventing the solder 13 from spreading over the solder pad 9. The semiconductor chip 1 is then available for mounting on a substrate.

What is claimed is:

1. A method of making an electronic component, the method comprising:
    forming an electrically conductive redistribution line on a surface of a semiconductor chip, the redistribution line including a solder pad;
    forming a covering material over the solder pad;
    passivating an uncovered portion of the redistribution line, the covering material preventing passivation of the solder pad; and
    forming solder over the solder pad, the uncovered portion of the redistribution line having solder resist properties due to the passivating.

2. The method according to claim 1, wherein forming an electrically conductive redistribution line comprises:
    forming a conductive layer over the surface of the semiconductor chip;
    forming a mask over the conductive layer, the mask including a mask opening corresponding to a pattern of the redistribution line; and
    forming conductive material in the mask opening.

3. The method according to claim 2, wherein the conductive layer comprises a seed layer and wherein the conductive material comprises copper.

4. The method according to claim 2, wherein passivating the uncovered portion of the redistribution line comprises forming a solder resist layer over the uncovered portion of the redistribution lines, and wherein forming the solder comprises melting the solder onto the solder pad, the solder being restricted by the solder resist layer.

5. The method according to claim 2, further comprising:
    removing the covering material after passivating the uncovered portion of the redistribution line; and
    removing portions of the conductive layer and the mask not beneath the redistribution line.

6. The method according to claim 5, wherein the covering material is removed at the same time as the mask.

7. The method according to claim 1, wherein the covering material has properties of a flux, the solder being formed over the covering material.

8. The method according to claim 7, wherein forming solder over the solder pad comprises forming a solder ball into an opening that remains over the solder pad.

9. The method according to claim 1, wherein passivating comprises forming a layer of material that acts as both a passivation layer and a solder resist layer.

10. The method according to claim 9, wherein forming a layer of material comprises forming a nickel layer.

11. The method according to claim 9, wherein forming a layer of material comprises forming a polymer layer.

12. The method according to claim 9, wherein forming a layer of material comprises oxidizing a surface of the redistribution line.

13. The method according to claim 12, wherein forming a layer of material comprises oxidizing copper.

14. The method according to claim 1, wherein the covering material comprises a solder paste.

15. The method according to claim 14, wherein forming solder over the solder pad comprises melting the solder paste.

16. The method according to claim 15, wherein the uncovered portion of the redistribution line is passivated after melting the solder paste.

17. The method according to claim 16, wherein the uncovered portion of the redistribution line is passivated by oxidation.

18. The method according to claim 1, wherein forming the covering material comprises applying the covering material using a screen printing process.

19. A method of making a semiconductor component, the method comprising:
    forming a seed layer over a surface of a semiconductor chip;
    forming a mask over the seed layer, the mask having a mask opening;
    forming a redistribution line within the mask opening;
    covering a solder pad portion of the redistribution line;
    forming a passivation layer over an uncovered portion of the redistribution line, the passivation layer also serving as a solder resist layer;
    removing the mask;
    applying solder over the surface of the semiconductor chip; and
    forming a solder ball by melting the solder so that the solder adheres to the solder pad, the passivation layer serving as a resist layer to prevent the solder from adhering to portions of the redistribution line outside the solder pad.

20. The method according to claim 19, wherein forming the passivation layer comprises forming a nickel layer.

21. The method according to claim 19, wherein forming the passivation layer comprises forming a polymer layer.

22. The method according to claim 19, wherein forming the passivation layer comprises oxidizing a surface of the redistribution line.

23. The method according to claim 19, further comprising uncovering the solder pad before applying solder over the surface of the semiconductor chip.

24. The method according to claim 19, wherein covering the solder pad comprises covering the solder pad with a flux material and wherein applying solder over the surface of the semiconductor chip comprises applying solder over the flux material.

25. A method of making a semiconductor component, the method comprising:
   forming a redistribution line over a surface of a semiconductor chip, the redistribution line including a solder pad;
   covering the solder pad with a solder paste;
   melting the solder paste;
   after melting the solder paste, forming a passivation layer over another portion of the redistribution line, wherein forming the passivation layer comprises oxidizing the other portion of the redistribution line;
   applying solder over the surface of the semiconductor chip; and
   forming a solder ball by melting the solder so that the solder adheres to the solder pad, the passivation layer serving as a resist layer to prevent the solder from adhering to the other portion of the redistribution line.

26. The method according to claim 25, wherein forming the redistribution line comprises:
   forming a seed layer over the surface of the semiconductor chip;
   forming a mask over the seed layer, the mask having a mask opening; and
   forming the redistribution line within the mask opening.

27. The method according to claim 25, wherein covering the solder pad with a solder paste comprises performing a screen printing process.

28. The method according to claim 25, wherein the solder paste comprises a material that includes small particles of solder bound in a flux.

* * * * *